United States Patent
Xiao et al.

(10) Patent No.: US 9,338,882 B2
(45) Date of Patent: May 10, 2016

(54) BROADSIDE COUPLED DIFFERENTIAL TRANSMISSION LINES HAVING ALTERNATING WIDE AND NARROW PORTIONS

(71) Applicant: Intel Corporation, Santa Clara, CA (US)

(72) Inventors: Kai Xiao, University Place, WA (US); Raul Enriquez Shibayama, Zapopan (MX); Gong Ouyang, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/278,330

(22) Filed: May 15, 2014

(65) Prior Publication Data

US 2015/0333387 A1    Nov. 19, 2015

(51) Int. Cl.
*H05K 1/02* (2006.01)
*H01P 3/02* (2006.01)
*H01P 3/08* (2006.01)
*H01P 11/00* (2006.01)
*B33Y 10/00* (2015.01)
*B33Y 80/00* (2015.01)

(52) U.S. Cl.
CPC ............... *H05K 1/0245* (2013.01); *H01P 3/02* (2013.01); *H01P 3/08* (2013.01); *H01P 11/003* (2013.01); *B33Y 10/00* (2014.12); *B33Y 80/00* (2014.12); *H05K 2201/09281* (2013.01); *Y10T 29/49156* (2015.01)

(58) Field of Classification Search
CPC .......... H05K 1/0245; H01P 5/187; H01P 3/02
USPC ....................................... 333/1, 4, 5
See application file for complete search history.

(56) References Cited

U.S. PATENT DOCUMENTS

2008/0264673 A1* 10/2008 Chi et al. .................. 174/250
2008/0273288 A1* 11/2008 Horowitz et al. ........... 361/303

* cited by examiner

*Primary Examiner* — Benny Lee
(74) *Attorney, Agent, or Firm* — International IP Law Group, P.L.L.C.

(57) ABSTRACT

A broadside coupled differential design is described herein. The design may include a differential pair. Each trace of the differential pair includes a wide portion and a narrow portion. The wide portion of the first trace of the differential pair is to be aligned with a narrow portion of the second trace of the differential pair. Additionally, the wide portion of the second trace of the differential pair is to be aligned with a narrow portion of the first trace of the differential pair, such that the wide and narrow portions of the traces of the differential pair are staggered.

24 Claims, 9 Drawing Sheets

100

400

410

420

700

800

BROADSIDE COUPLED DIFFERENTIAL TRANSMISSION LINES HAVING ALTERNATING WIDE AND NARROW PORTIONS

TECHNICAL FIELD

The present techniques generally relate to differential pair designs. Specifically, the present techniques relate to a broadside coupled differential design.

BACKGROUND ART

A broadside coupled differential design couples the broadside of each trace. In some cases, each transmission lines may be stacked such that the differential traces are routed one over each other on consecutive layers of a substrate. The width of the strip that forms each trace and the thickness of the substrate on which the strip is formed can determine the impedance of the broadside coupled striplines when used as transmission lines.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DETAILED DESCRIPTION OF THE PREFERRED EMBODIMENTS

Figure 1:
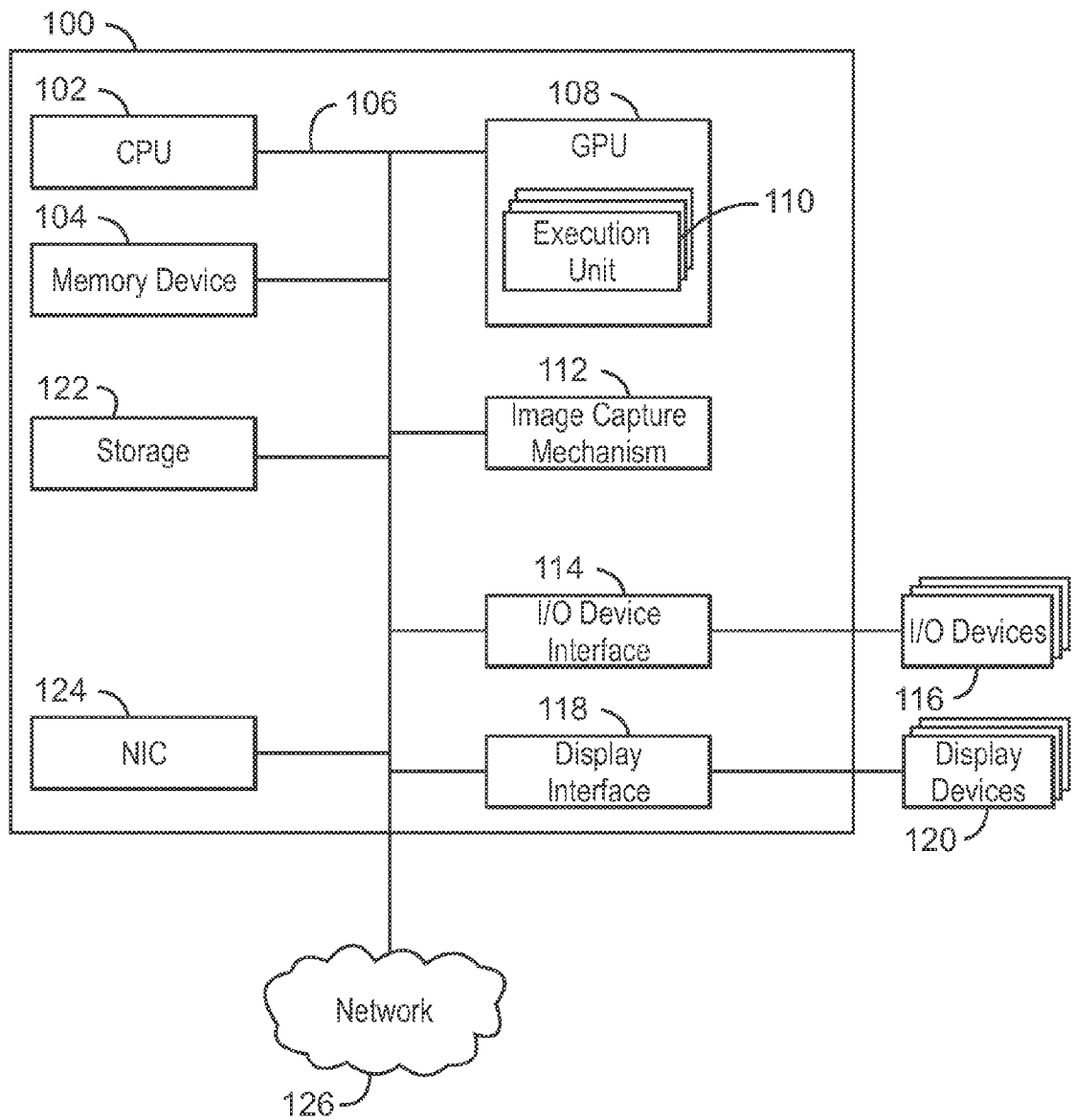
FIG. 1 is a block diagram of a computing device that may be used with the broadside coupled striplines described herein.

A broadside coupled differential design typically includes a characteristic impedance. In some cases, the impedance is a ratio of the amplitudes of voltage and current wave propagating along the transmission lines. Further, in differential mode impedance, the voltage is defined between the two lines, and the current is flowing in the opposite direction in the two lines. During the manufacture of a printed circuit board (PCB), the PCB is printed in layers with varying degrees of precision. The precision with which layers are printed on top of each other during the manufacture of a PCB is referred to as layer-to-layer registration. Efficient high volume manufacturing relies on the ability to control impedance in differential designs, even when layer-to-layer misregistration occurs.

Embodiments described herein include a broadside coupled differential design. A system may include a differential pair. Each trace in the differential pair includes a wide portion and a narrow portion. The wide portion of the first trace of the differential pair is aligned with a narrow portion of the second trace of the differential pair. Additionally, the wide portion of the second trace of the differential pair is aligned with a narrow portion of the first trace of the differential pair, such that the wide and narrow portions of each trace in the differential pair are staggered. The traces have a complimentary electric potential, where the electric potential is of the same magnitude but opposite polarity. In some cases, the broadside coupled differential design improves impedance control even when layer-to-layer misregistration occurs during the manufacture of broadside coupled differential designs.

In some examples, a broadside coupled differential design includes coupling the broadside of each trace. The pair of traces may be adjacent signal layers in a dual stripline configuration. The two striplines may be traces, and each stripline may be a flat strip of metal which is sandwiched between two parallel ground planes. Accordingly, each trace may include a wide, broad, portion and an edge portion. The wide, broad, portion of a first trace may be coupled to the wide, broad, portion of a second trace, thereby forming a broadside coupled differential pair. In other examples, the present techniques are used to couple both striplines and microstrips, where a microstrip is on the surface of a substrate.

With the present techniques, a broadside coupled stripline has controlled impedance variation, even when there is a layer-to-layer misalignment. In this manner, impedance is controlled without increasing the width of the traces. Accordingly, the present techniques do not result in a lower impedance than desired. Further, the present techniques can be used with a high layout density, smaller form factors, lower costs, and potentially better performance.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present techniques. It will be apparent, however, to one skilled in the art that these specific details need not be employed to practice the present techniques. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present techniques.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most computing fabrics to provide highest possible performance with maximum power saving. Below, a number of interconnects are discussed, which would potentially benefit from aspects of the present techniques described herein.

FIG. 1 is a block diagram of a computing device 100 that may be used with the broadside coupled striplines described herein. The computing device 100 may be, for example, a laptop computer, desktop computer, ultrabook, tablet computer, mobile device, or server, among others. The computing device 100 may include a central processing unit (CPU) 102 that is configured to execute stored instructions, as well as a memory device 104 that stores instructions that are executable by the CPU 102. The CPU may be coupled to the memory device 104 by a bus 106. Additionally, the CPU 102 can be a single core processor, a multi-core processor, a computing cluster, or any number of other configurations. Furthermore, the computing device 100 may include more than one CPU 102.

The computing device 100 may also include a graphics processing unit (GPU) 108. As shown, the CPU 102 may be coupled through the bus 106 to the GPU 108. The GPU 108 may be configured to perform any number of graphics operations within the computing device 100. For example, the GPU 108 may be configured to render or manipulate graphics images, graphics frames, videos, or the like, to be displayed to a user of the computing device 100. The GPU 108 includes a plurality of execution units 110. The executions units 110 may process threads from any number of graphics operations. The memory device 104 can include random access memory (RAM), read only memory (ROM), flash memory, or any other suitable memory systems. For example, the memory device 104 may include dynamic random access memory (DRAM).

The computing device 100 may also includes an image capture mechanism 112. Further, the CPU 102 may also be connected through the bus 106 to an input/output (I/O) device interface 114 configured to connect the computing device 100 to one or more I/O devices 116. The I/O devices 116 may include, for example, a keyboard and a pointing device, wherein the pointing device may include a touchpad or a touchscreen, among others. The I/O devices 116 may be built-in components of the computing device 100, or may be devices that are externally connected to the computing device 100.

The CPU 102 may be linked through the bus 106 to a display interface 118 configured to connect the computing device 100 to a display device 120. The display device 120 may include a display screen that is a built-in component of the computing device 100. The display device 120 may also include a computer monitor, television, or projector, among others, that is externally connected to the computing device 100.

The computing device also includes a storage device 122. The storage device 122 is a physical memory such as a hard drive, an optical drive, a thumbdrive, an array of drives, or any combinations thereof. The storage device 122 may also include remote storage drives. The computing device 100 may also include a network interface controller (NIC) 124 may be configured to connect the computing device 100 through the bus 106 to a network 126. The network 126 may be a wide area network (WAN), local area network (LAN), or the Internet, among others.

Each block illustrated in FIG. 1 may be connected to other blocks using a broadside coupled differential design. A differential pair may be included in a high density circuit design. For example, the bus 106 may include a broadside coupled differential design. The block diagram of FIG. 1 is not intended to indicate that the computing device 100 is to include all of the components shown in FIG. 1. Further, the computing device 100 may include any number of additional components not shown in FIG. 1, depending on the details of the specific implementation. Any additional components may be communicatively coupled with any other components of the computing device 100 using a broadside coupled differential design.

Figure 2:
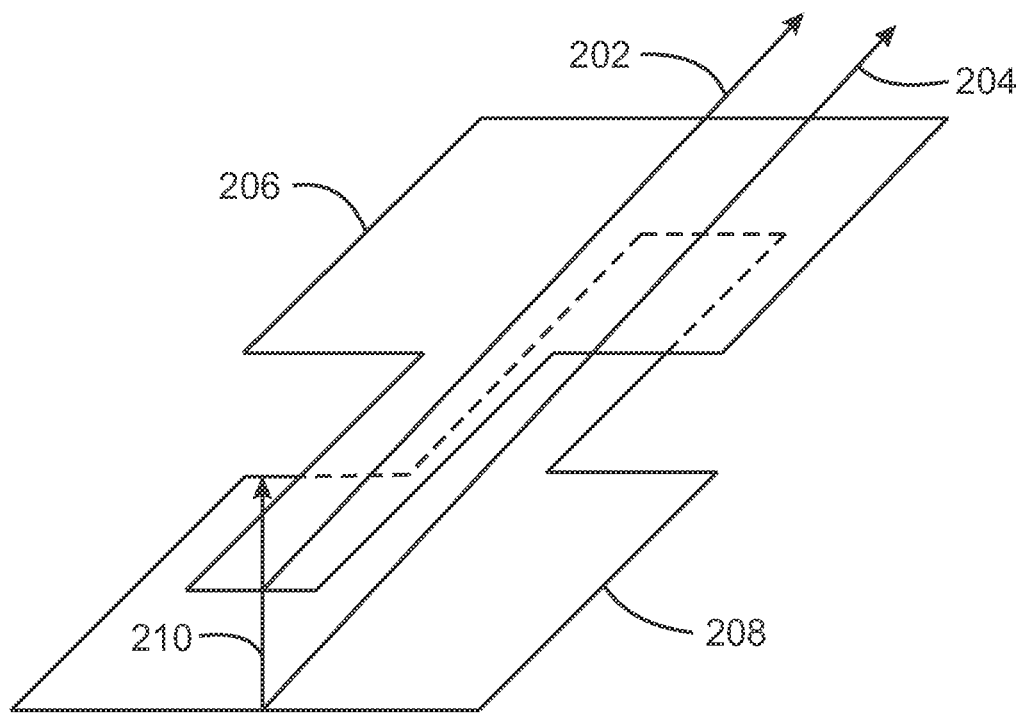
FIG. 2 is an illustration of broadside coupled differential design without a misregistration error.

FIG. 2 is an illustration of broadside coupled differential design 200 without a misregistration error. An arrow 202 and an arrow 204 indicate signal transmission using a non-uniform trace 206 and a non-uniform trace 208. Each of the trace 206 and the trace 208 includes a wide portion and a narrow portion. As illustrated, each of the wide portion and the narrow portion of the trace 206 alternates inversely with the wide portion and the narrow portion of the trace 208. In some cases, the traces may be referred to as vertically coupled traces. The non-uniform trace 206 is broadside coupled with the non-uniform trace 208, and an arrow 210 indicates a center point of the non-uniform trace 206 and the non-uniform trace 208. Signals may be transmitted along the trace 206 and the trace 208, each centered along the center point indicated by the arrow 210.

Each of the trace 206 and the trace 208 are non-uniform in that the geometry of each trace varies along the length of each trace across the printed circuit board (PCB). The geometry of each trace may vary by size and shape, and the geometry may vary in an alternating fashion between each trace. In other words, a variation in a first trace of the differential pair can be complimentary to a variation reflected in a second trace of the differential pair. In embodiments, each is divided into segments, and the width of each trace alternates between segments. In a first segment, a first trace of the differential pair may have a first width, and a second segment may have a second width. In a second segment, the first trace of the differential pair may have the second width, and the second segment may have the first width. Each subsequent segment along the length of the broadside coupled differential design may have alternating widths between the first and second trace.

As illustrated, the trace 206 and the trace 208 do not have a misregistration error between the traces. In other words, during the manufacture of a PCB including the trace 206 and the trace 208, the trace 206 and the trace 208 are printed one on top of the other with an exact precision of placement such that they are precisely stacked within the PCB. Thus, the center point at the arrow 210 illustrates the precise coupling between signals that are transmitted along the trace 206 and the trace 208. Such precise printing of the trace 206 and the trace 208 may be difficult to achieve in high volume manufacturing.

Figure 3:
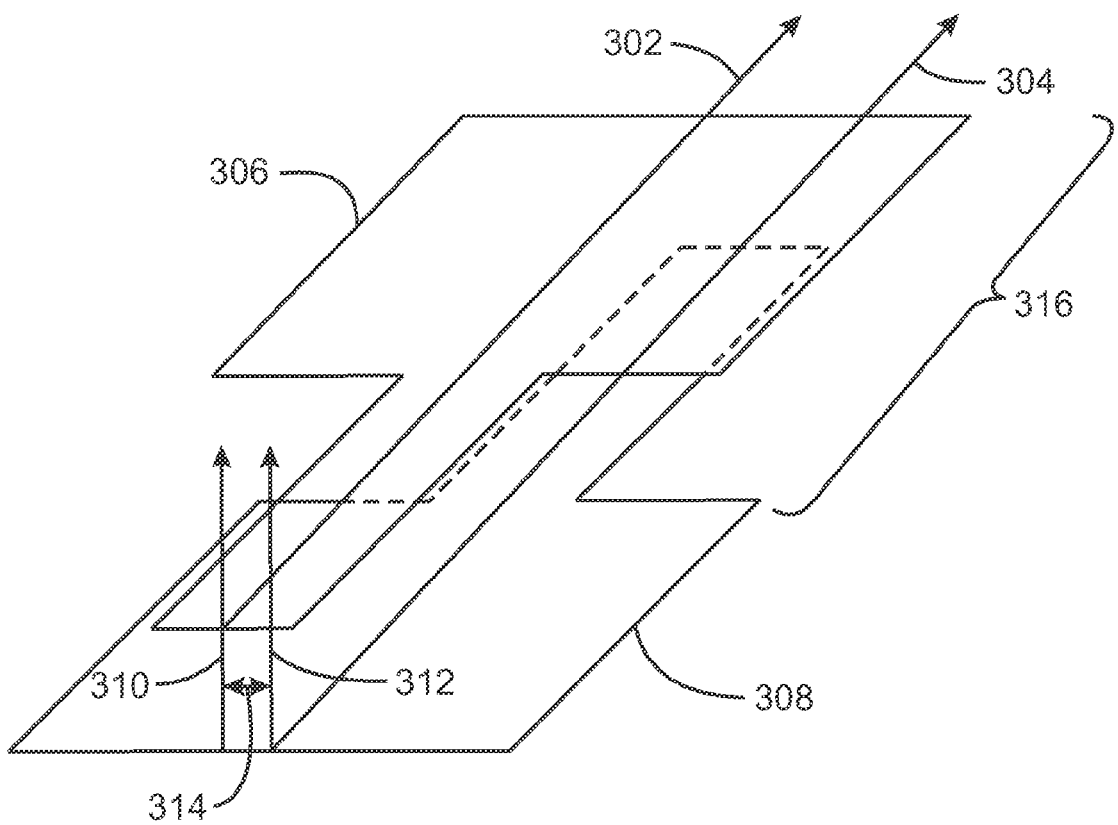
FIG. 3 is an illustration of broadside coupled differential design with a misregistration error.

FIG. 3 is an illustration of broadside coupled differential design 300 with a misregistration error. An arrow 302 and an arrow 304 indicate signal transmission using a non-uniform trace 306 and a non-uniform trace 308. The non-uniform trace 306 is broadside coupled with the non-uniform trace 308. An arrow 310 indicates a center point of the non-uniform trace 306. A signal may be transmitted along the trace 306 positioned along the center point of the non-uniform trace 306 indicated by the arrow 310. Similarly, an arrow 312 indicates a center point of the non-uniform trace 308. A signal may be transmitted along the trace 308 positioned along the center point of the non-uniform trace 308 indicated by the arrow 312.

As illustrated, the trace 306 and the trace 308 have a misregistration error between the traces. During the manufacture of a PCB including the trace 306 and the trace 308, the trace 306 and the trace 308 are printed one on top of the other with an offset, such that the traces are not precisely stacked within the PCB. This offset is illustrated at reference number 314. A signal that travels along the arrow 302 will be offset compared to the signal along the arrow 304. However, each of the trace 306 and the trace 308 are non-uniform, such that each of the trace 306 and the trace 308 includes a wide portion and a narrow portion. As illustrated, each of the wide portion and the narrow portion the trace 306 alternates in a complimentary fashion with the wide portion and the narrow portion the trace 308. Accordingly, there is a misregistration error between the trace 306 and the trace 308 and the two segments will have an offset between them. However, as illustrated at the segment 316, a narrow segment of trace 308 is fully broadside coupled with the wide segment of trace 306.

Figure 4A:
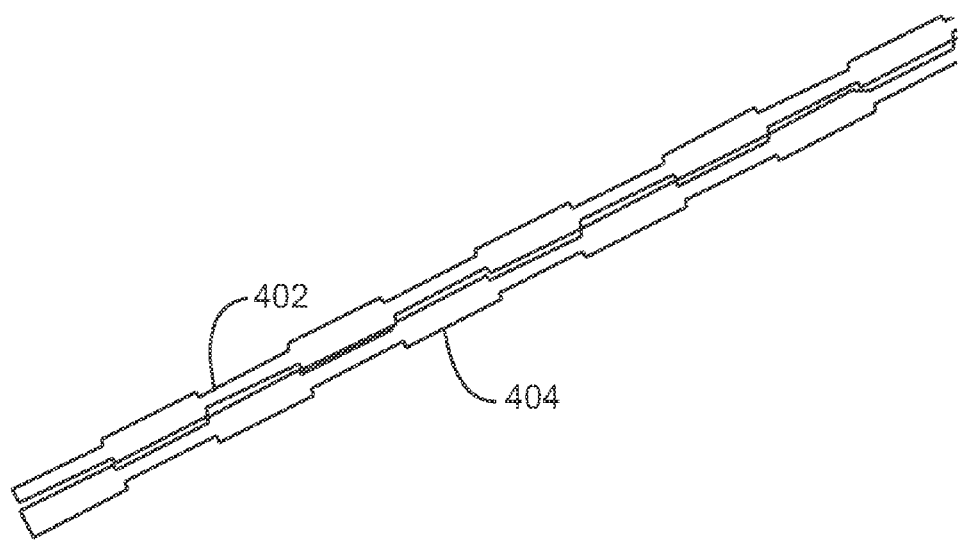
FIG. 4A is a three dimensional view of a broadside coupled differential design.

FIG. 4A is a three dimensional view of a broadside coupled differential design 400. The broadside coupled differential design 400 includes a non-uniform trace 402 and a non-uniform trace 404. Although the trace 402 and the trace 404 are illustrated with alternating segments of the same length, the length of the narrow and wide segments may vary depending on the implementation of the design 400. Further, the length and the width of each segment may be adjusted for impedance control and crosstalk mitigation.

Figure 4B:
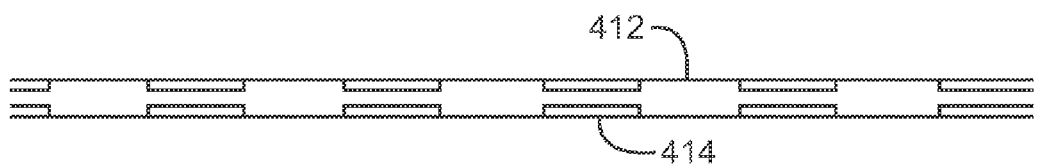
FIG. 4B is a top view of a broadside coupled differential design without a misregistration error.

FIG. 4B is a top view of a broadside coupled differential design 410 without a misregistration error. The broadside coupled differential design 410 includes a non-uniform trace 412 and a non-uniform trace 414. As illustrated, the non-uniform trace 412 and the non-uniform trace 414 do not have a misregistration error between the traces. Accordingly, the non-uniform trace 412 and the non-uniform trace 414 are printed one on top of the other with an exact precision of placement such that they are precisely stacked within the PCB.

Figure 4C:
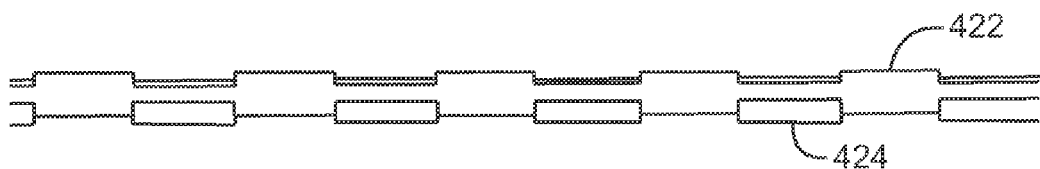
FIG. 4C is a top view of a broadside coupled differential design with a misregistration error.

FIG. 4C is a top view of a broadside coupled differential design 420 with a misregistration error. The broadside coupled differential design 420 includes a non-uniform trace 422 and a non-uniform trace 424. As illustrated, the non-uniform trace 422 and the non-uniform trace 424 do have a misregistration error between the traces. The non-uniform trace 422 and the non-uniform trace 424 are not precisely aligned during manufacture. Accordingly, the uniform trace 422 and the non-uniform trace 424 are offset with respect to their vertical position on the PCB. However, the non-uniform geometry of the trace 422 and the trace 424 enable each trace to be broadside coupled, even in the presence of a misregistration error.

Figure 5:
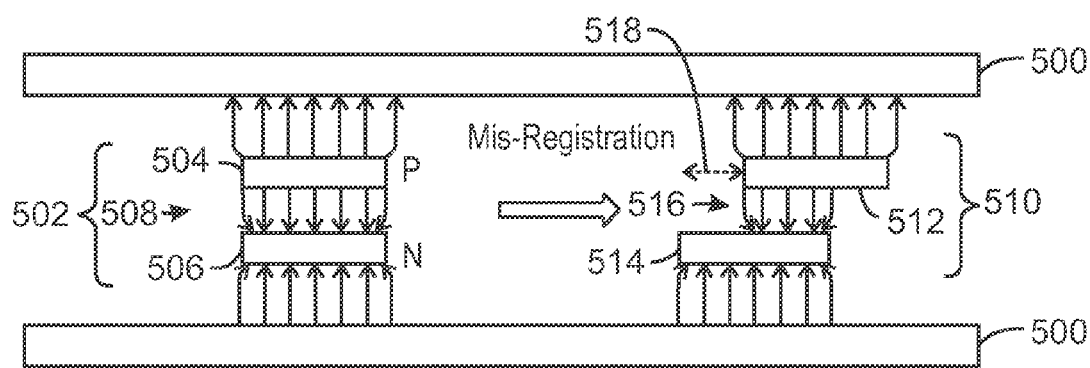
FIG. 5 is an illustration of misregistration in a printed circuit board with respect to electrical field lines.

FIG. 5 is an illustration of misregistration in a printed circuit board 500 with respect to electrical field lines. A first broadside coupled differential pair 502 includes a trace of positive (P) electrical potential 504 and a trace of negative (N) electrical potential 506. Electrical field lines are illustrated by the arrows 508.

In some cases, the impedance observed by the differential pair 502 is proportional to the square root of $L_0-L_M$, and is inversely proportional to $C_0+C_M$. In the variables mentioned above, $L_0$ is the self inductance of a single trace; $C_0$ is the self capacitance of the single trace; $L_M$ is the mutual inductance between the two traces of the differential pair; and $C_M$ is the mutual capacitance between the two traces of the differential pair. Accordingly, an increase in capacitance or decrease in inductance results in a decrease in impedance. Further, an increase in inductance decrease in capacitance results in an increase in impedance.

In FIG. 5, the broadside coupled differential pair 502 has no misregistration error. Further, as a result of no misregistration error, the broadside coupled differential pair 502 has a maximum mutual capacitance $C_M$ between the trace 504 and the trace 506.

A second broadside coupled differential pair 510 includes a trace of positive electrical potential 512 and a trace of negative electrical potential 514. Electrical field lines are illustrated by the arrows 516. The misregistration in the second broadside coupled differential pair 510 is due to an offset 518. The misregistration error can cause a reduction in mutual capacitance $C_M$, as there is a reduction in electrical field coupling. The reduction in electrical field coupling is illustrated in FIG. 5 with fewer arrows 516 when compared to the arrows 508. As illustrated, the offset between the first trace and the second trace when a misregistration error is present can cause less electrical field coupling, as less of each trace is positioned over the other trace. As discussed above, less mutual capacitance $C_M$ results in a higher impedance of the broadside coupled differential pair.

Figure 6:
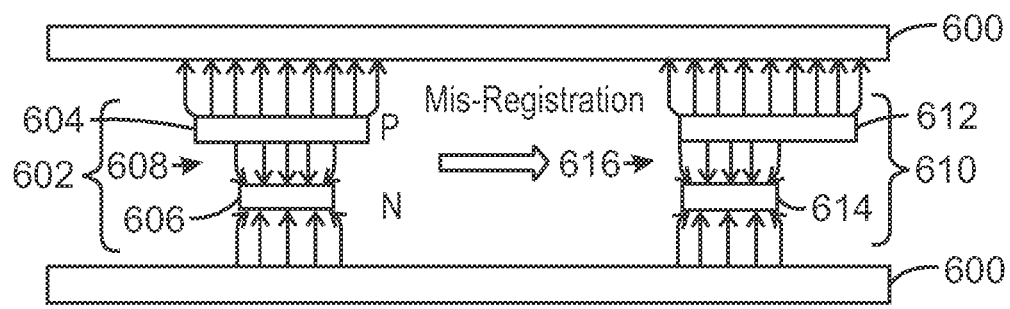
FIG. 6 is an illustration of a printed circuit board with misregistration in two broadside coupled differential pairs.

FIG. 6 is an illustration of a printed circuit board 600 with misregistration in two broadside coupled differential pairs. The first differential pair 602 includes a trace of positive (P) electrical potential 604 and a trace of negative (N) electrical potential 606. Electrical field lines are illustrated by the arrows 608. The positive trace 604 and the negative trace 606 each have uniform geometries. The uniform geometries occur into the plane of FIG. 6. The second differential pair 610 includes a positive trace 612 and a negative trace 614, where the positive trace 612 and the negative trace 614 include a complimentary electric potential, where potential is of the same magnitude but opposite polarity. Electrical field lines are illustrated by the arrows 616. The positive trace 612 and the negative trace 614 each have non-uniform geometries as discussed with respect to FIGS. 2-4. The non-uniform geometries occur into the plane of FIG. 6. As earlier discussed, to ensure that a differential pair is always broadside coupled even in the presence of a misregistration error, the non-uniform differential traces alternate between narrow and wide sections along the length of the trace. The offset and resulting misregistration error is managed such that the mutual capacitance $C_M$ present using non-uniform trace geometry is larger than the mutual capacitance $C_M$ without non-uniform trace geometry. Accordingly, the sensitivity of the mutual capacitance $C_M$ to misregistration is minimized. Further, minimizing the sensitivity of the mutual capacitance $C_M$ results in a minimized sensitivity of the impedance of the broadside coupled differential pair during layer-to-layer misregistration.

Figure 7:
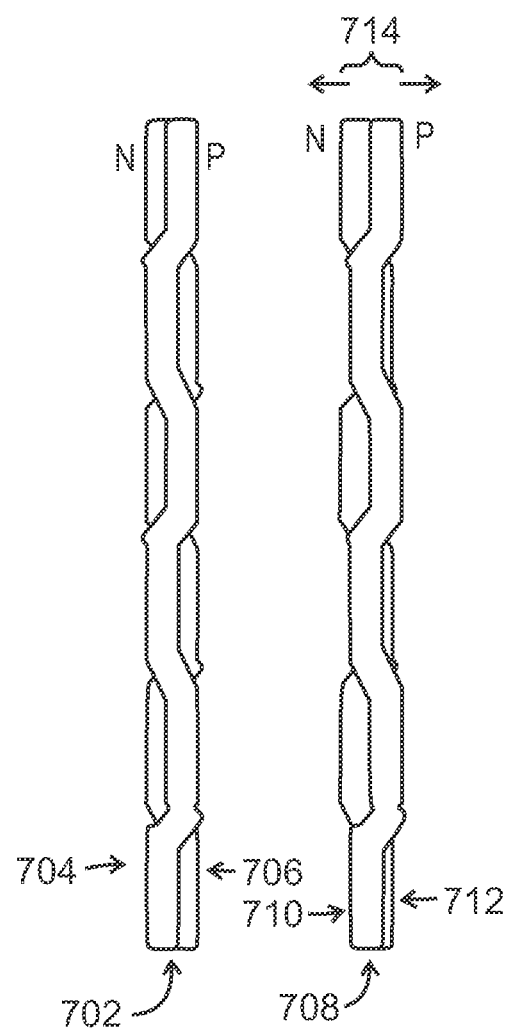
FIG. 7 is a top view of two broadside coupled differential designs 700 with uniform trace widths.

FIG. 7 is a top view of two broadside coupled differential designs 700 with uniform trace widths. A first broadside coupled differential pair 702 includes a top uniform trace 704 and a bottom uniform trace 706 without a misregistration error. The mutual capacitance along the trace (except the crossing point) roughly is kept at the same value ($C_m$). A second broadside coupled differential pair 708 includes a top uniform trace 710 and a bottom uniform trace 712 with a misregistration error. The misregistration error is indicated by arrows 714 that indicate how the top uniform trace 710 and the bottom uniform trace 712 are not printed precisely one atop the other.

The mutual capacitance of the second broadside coupled differential pair 708 is increased during segments of the second broadside coupled differential pair 708 that include a wide portion of the uniform trace 710. The mutual capacitance of the second broadside coupled differential pair 708 is decreased during segments of the second broadside coupled differential pair 708 that include a wide portion of the uniform trace 712. The overall mutual capacitance of the second broadside coupled differential pair 708 changes little from the overall mutual capacitance of the first broadside coupled differential pair 702. As a result, the impedance of the second broadside coupled differential pair 708 changes little from the impedance of the first broadside coupled differential pair 702.

Figure 8:
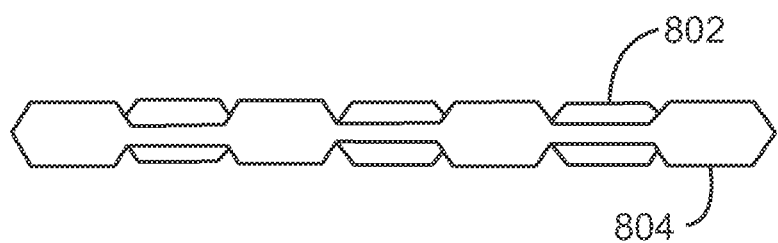
FIG. 8 is a top view of a broadside coupled differential design 800 without a misregistration error.

FIG. 8 is a top view of a broadside coupled differential design 800 without a misregistration error. The broadside coupled differential design 800 includes a non-uniform trace 802 and a non-uniform trace 804. As illustrated, each of the non-uniform trace 802 and the non-uniform trace 804 form a trapezoidal patch in each segment of the broadside coupled differential design 800. The present techniques can be used with any shape of trace to form the narrow and wide portions of each segment in a broadside coupled differential design. For example, each of the non-uniform traces in a broadside coupled differential design may form a circular shape from the narrow and wide portions of each segment in the broadside coupled differential design.

Figure 9:
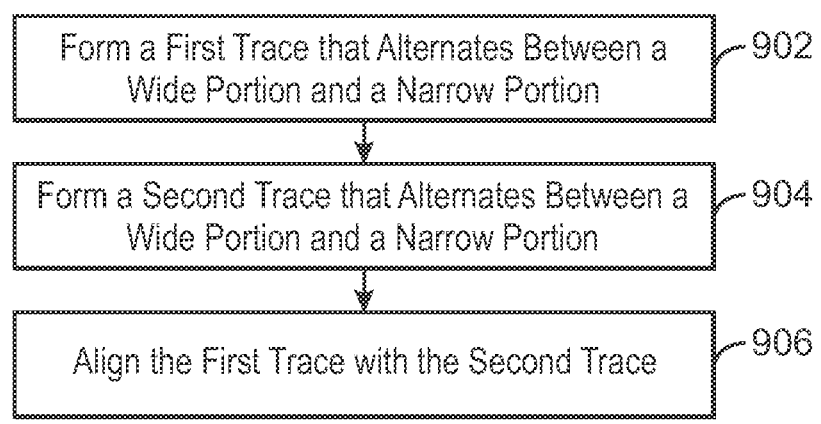
FIG. 9 is a process flow diagram of a method for forming a broadside coupled differential design with non-uniform geometries.

FIG. 9 is a process flow diagram of a method for forming a broadside coupled differential design with non-uniform geometries. At block 902, a first trace is formed that alternates between a wide portion and a narrow portion. The first trace may be etched into a printed circuit board (PCB). At block 904, a second trace is formed or etched that alternates between a wide portion and a narrow portion. The second trace may also be etched into a printed circuit board on a layer above the first trace formed into the PCB. The layers of the PCB may be formed using an additive process, where the traces and an insulating substrate are added to the PCB in layers. At block 906, the first trace is aligned with the second trace, such that the wide portion of the first trace is aligned with the narrow portion of the second trace, and the narrow portion of the first trace is aligned with the wide portion of the second trace. The multi-layer PCB may be a laminated board with multiple traces. Circuitry can etched on each side of a multi-layer PCB.

EXAMPLE 1

A broadside coupled differential design includes a first trace and a second trace. The first trace that is to alternate between a wide portion and a narrow portion. The second trace that is to alternate between a wide portion and a narrow portion, wherein the wide portion of the first trace is aligned with the narrow portion of the second trace, and the narrow portion of the first trace is aligned with the wide portion of the second trace.

The second trace may be complimentary to the first trace. A length and a width of the first trace and the second trace may be adjusted for impedance control and crosstalk mitigation. The first trace and the second trace may be non-uniform traces such that the geometry of each trace may vary along the length of each trace. Additionally, the wide portion of the first trace may be completely coupled with the narrow portion of the second trace. The wide portion of the second trace may be completely coupled with the narrow portion of the first trace. Further, the first trace and the second trace may be fully broadside coupled with a misregistration error between the first trace and the second trace. A portion of the first trace and a complimentary portion of the second trace may form a segment of the broadside coupled differential design. Moreover, a length and a width of each segment may be designed based on impedance control, or a length and a width of each segment may be designed based on crosstalk mitigation. The design may be included in a high density layout.

EXAMPLE 2

A system for broadside coupled differential design includes a differential pair. The differential pair includes a first trace and a second trace that are complimentary. Each trace includes a wide portion and a narrow portion, and a wide portion of the first trace of the differential pair is aligned with a narrow portion of the second trace of the differential pair, such that the wide and narrow portions of the differential pair are staggered.

A length and a width of the first trace and the second trace may be adjusted for impedance control and crosstalk mitigation. The first trace and the second trace may be non-uniform traces such that the geometry of each trace varies along the length of each trace. Additionally, the wide portion of the first trace may be completely coupled with the narrow portion of the second trace, or the wide portion of the second trace may be completely coupled with the narrow portion of the first trace. The first trace and the second trace may be fully broadside coupled with a misregistration error between the first trace and the second trace. Further, a portion of the first trace and a complimentary portion of the second trace form a segment of the broadside coupled differential design. A length and a width of each segment may be adjusted for impedance control, or a length and a width of each segment may be adjusted for crosstalk mitigation. Moreover, the differential pair may be included in a high density circuit design.

EXAMPLE 3

A method for a broadside coupled differential design includes forming a first trace that alternates between a wide portion and a narrow portion and forming a second trace that alternates between a wide portion and a narrow portion. The method also includes aligning the first trace and the second trace, such that the wide portion of the first trace is aligned with the narrow portion of the second trace, and the narrow portion of the first trace is aligned with the wide portion of the second trace.

The first trace may include a plurality of wide and narrow portions, and the second trace may include a plurality of wide and narrow portions. Further, the plurality of wide and narrow portions of the first trace and the plurality of wide and narrow portions of the second trace may be staggered such that each wide portion of the first trace may be aligned with each narrow portion of the second trace, and each narrow portion of the first trace may be aligned with each wide portion of the second trace. The second trace may be etched onto a printed circuit board (PCB) on a layer above the first trace formed into the PCB. Additionally, the layers of the PCB may be formed using an additive process. The broadside coupled differential design may be formed in a laminated board with multiple traces. Also, the first trace and the second trace may be complimentary, non-uniform traces. A length and a width of the first trace and the second trace may be adjusted for impedance control and crosstalk mitigation. The first trace and the second trace may be fully broadside coupled with a misregistration error between the first trace and the second trace. Additionally, the misregistration error may be managed such that the mutual capacitance $C_M$ present using non-uniform trace geometry may be larger than the mutual capacitance $C_M$ without non-uniform trace geometry.

EXAMPLE 4

An apparatus includes a means for transmitting complimentary signals. A first means for transmitting complimentary signals is to alternate between a wide portion and a narrow portion. A second means for transmitting complimentary signals is to alternate between a wide portion and a narrow portion and is complimentary to the first means, such that the wide portion of the first means is aligned with the narrow portion of the second means, and the narrow portion of the first means is aligned with the wide portion of the second means.

A length and a width of the first means for transmitting complimentary signals and the second means for transmitting complimentary signals may be adjusted for impedance control and crosstalk mitigation. The first means for transmitting complimentary signals and the second means for transmitting complimentary signals may be non-uniform such that the geometry of each means for transmitting complimentary signals varies along the length of each means for transmitting complimentary signals. Additionally, the wide portion of the first means for transmitting complimentary signals may be completely coupled with the narrow portion of the second means for transmitting complimentary signals. The wide portion of the second means for transmitting complimentary signals may be completely coupled with the narrow portion of the first means for transmitting complimentary signals. Further, the first means for transmitting complimentary signals and the second means for transmitting complimentary signals may be fully broadside coupled with a misregistration error between the first means for transmitting complimentary signals and the second means for transmitting complimentary signals. A portion of the first means for transmitting complimentary signals and a complimentary portion of the second means for transmitting complimentary signals may form a segment of a broadside coupled differential design. Additionally, a length and a width of each segment may be adjusted for impedance control, or a length and a width of each segment may be adjusted for crosstalk mitigation. The broadside coupled design may be included in a high density layout.

While the present techniques have been described with respect to a limited number of embodiments, those skilled in the art will appreciate numerous modifications and variations therefrom. It is intended that the appended claims cover all such modifications and variations as fall within the true spirit and scope of this present techniques.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present techniques.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation.

But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the present techniques may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present techniques. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the present techniques as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A broadside coupled differential design, comprising:
 a first trace that is to alternate between a wide portion and a narrow portion;
 a second trace that is to alternate between a wide portion and a narrow portion, wherein the wide portion of the first trace is aligned with the narrow portion of the second trace, and the narrow portion of the first trace is aligned with the wide portion of the second trace.

2. The broadside coupled differential design of claim 1, wherein a length and a width of the first trace and the second trace is to be adjusted for impedance control and crosstalk mitigation.

3. The broadside coupled differential design of claim 1, wherein the first trace and the second trace are non-uniform traces such that the geometry of each trace is to vary along a length of each trace.

4. The broadside coupled differential design of claim 1, wherein the wide portion of the first trace is to be completely coupled with the narrow portion of the second trace.

5. The broadside coupled differential design of claim 1, wherein the wide portion of the second trace is to be completely coupled with the narrow portion of the first trace.

6. The broadside coupled differential design of claim 1, wherein the first trace and the second trace are to be fully broadside coupled with a misregistration error between the first trace and the second trace.

7. The broadside coupled differential design of claim 1, wherein a portion of the first trace and a complimentary portion of the second trace are to form a segment of the broadside coupled differential design.

8. The broadside coupled differential design of claim 7, wherein a length and a width of the segment is to be designed for impedance control.

9. The broadside coupled differential design of claim 7, wherein a length and a width of each segment is to be designed for crosstalk mitigation.

10. A system for broadside coupled differential design, comprising:
a differential pair, including a first trace and a second trace that are complimentary, wherein each trace includes a wide portion and a narrow portion, and a wide portion of the first trace of the differential pair is aligned with a narrow portion of the second trace of the differential pair, such that the wide and narrow portions of the differential pair are staggered.

11. The system of claim 10, wherein a length and a width of the first trace and the second trace is to be adjusted for impedance control and crosstalk mitigation.

12. The system of claim 10, wherein the first trace and the second trace are non-uniform traces such that the geometry of each trace is to vary along a length of each trace.

13. The system of claim 10, wherein the wide portion of the first trace is to be completely coupled with the narrow portion of the second trace.

14. The system of claim 10, wherein the wide portion of the second trace is to be completely coupled with the narrow portion of the first trace.

15. The system of claim 10, wherein the first trace and the second trace are to be fully broadside coupled with a misregistration error between the first trace and the second trace.

16. The system of claim 10, wherein a portion of the first trace and a complimentary portion of the second trace are to form a segment of the broadside coupled differential design.

17. The system of claim 16, wherein a length and a width of the segment is adjusted for impedance control.

18. The system of claim 16, wherein a length and a width of the segment is adjusted for crosstalk mitigation.

19. A method for a broadside coupled differential design, comprising:
forming a first trace that alternates between a wide portion and a narrow portion;
forming a second trace that alternates between a wide portion and a narrow portion;
aligning the first trace and the second trace, such that the wide portion of the first trace is aligned with the narrow portion of the second trace, and the narrow portion of the first trace is aligned with the wide portion of the second trace.

20. The method of claim 19, wherein the first trace further includes a plurality of wide and narrow portions and the second trace further includes a plurality of wide and narrow portions.

21. The method of claim 20, wherein the plurality of wide and narrow portions of the first trace and the plurality of wide and narrow portions of the second trace are staggered such that each wide portion of the first trace is aligned with each narrow portion of the second trace, and each narrow portion of the first trace is aligned with each wide portion of the second trace.

22. The method of claim 19, wherein the second trace is etched onto a printed circuit board on a layer above the first trace formed into the PCB.

23. The method of claim 22, wherein the layers of the PCB are formed using an additive process.

24. The method of claim 19, wherein the broadside coupled differential design is formed in a laminated board with multiple traces.

* * * * *